United States Patent
Tham et al.

(10) Patent No.: US 11,072,851 B2
(45) Date of Patent: Jul. 27, 2021

(54) SPUTTERING TARGET (71) Applicants: TANAKA KIKINZOKU KOGYO K.K., Tokyo (JP); TOHOKU UNIVERSITY, Sendai (JP)

(72) Inventors: Kim Kong Tham, Tsukuba (JP); Ryousuke Kushibiki, Tsukuba (JP); Toshiya Yamamoto, Tsukuba (JP); Shin Saito, Sendai (JP); Shintaro Hinata, Sendai (JP)

(73) Assignees: TANAKA KIKINZOKU KOGYO K.K., Tokyo (JP); TOHOKU UNIVERSITY, Miyagi (JP)

(*) Notice: Subject to any disclaimer, the term of this patent is extended or adjusted under 35 U.S.C. 154(b) by 200 days.

(21) Appl. No.: 15/779,012

(22) PCT Filed: Nov. 15, 2016

(86) PCT No.: PCT/JP2016/083777
§ 371 (c)(1),
(2) Date: May 24, 2018

(87) PCT Pub. No.: WO2017/090481
PCT Pub. Date: Jun. 1, 2017

(65) Prior Publication Data
US 2018/0355473 A1    Dec. 13, 2018

(30) Foreign Application Priority Data
Nov. 27, 2015    (JP) .............................. JP2015-232446

(51) Int. Cl.
*C23C 14/34*    (2006.01)
*C22C 5/04*    (2006.01)
(Continued)

(52) U.S. Cl.
CPC .......... *C23C 14/3414* (2013.01); *C04B 35/01* (2013.01); *C22C 1/1084* (2013.01);
(Continued)

(58) Field of Classification Search
CPC ....................... C23C 14/3414; H01J 37/3429
See application file for complete search history.

(56) References Cited

U.S. PATENT DOCUMENTS

| 2006/0289294 A1 | 12/2006 | Racine et al. |
| 2009/0134015 A1 | 5/2009 | Racine et al. |

(Continued)

FOREIGN PATENT DOCUMENTS

| JP | 2007-004957 A | 1/2007 |
| JP | 2009-102707 A | 5/2009 |

(Continued)

OTHER PUBLICATIONS

PCT, International Search Report for PCT/JP2016/083777, dated Feb. 21, 2017.
(Continued)

*Primary Examiner* — John J Brayton
(74) *Attorney, Agent, or Firm* — Orrick, Herrington & Sutcliffe; Joseph A. Calvaruso; K. Patrick Herman (57) ABSTRACT

Provided is a sputtering target with which it is possible to form a magnetic thin film having a high coercive force Hc. The sputtering target is a sputtering target that contains metallic Co, metallic Pt, and an oxide, wherein the sputtering target contains no metallic Cr except inevitable impurities, the oxide has $B_2O_3$, and the sputtering target comprises 10 to 50 vol % of the oxide.

3 Claims, 4 Drawing Sheets (51) Int. Cl.
  C22C 1/10    (2006.01)
  H01J 37/34   (2006.01)
  C04B 35/01   (2006.01)
  C22C 19/07   (2006.01)
  G11B 5/851   (2006.01)
  C23C 14/06   (2006.01)
  C23C 14/18   (2006.01)
  C22C 1/05    (2006.01)
  C22C 1/04    (2006.01)

(52) U.S. Cl.
  CPC ............... *C22C 5/04* (2013.01); *C22C 19/07* (2013.01); *C23C 14/0688* (2013.01); *C23C 14/18* (2013.01); *G11B 5/851* (2013.01); *H01J 37/3429* (2013.01); *H01J 37/3491* (2013.01); *B22F 2998/10* (2013.01); *C04B 2235/3409* (2013.01); *C04B 2235/405* (2013.01); *C04B 2235/408* (2013.01); *C22C 1/0441* (2013.01); *C22C 1/0466* (2013.01); *C22C 1/05* (2013.01); *C22C 2202/02* (2013.01)

(56) References Cited

U.S. PATENT DOCUMENTS

| | | | |
|---|---|---|---|
| 2010/0243435 A1* | 9/2010 | Kato | C22C 5/04 204/298.03 |
| 2011/0253926 A1 | 10/2011 | Hayashi | |
| 2015/0021175 A1 | 1/2015 | Arakawa et al. | |
| 2017/0194131 A1 | 7/2017 | Tham et al. | |

FOREIGN PATENT DOCUMENTS

| | | |
|---|---|---|
| JP | 2012-117147 A | 6/2012 |
| JP | 2015-212409 A | 11/2015 |
| WO | WO 2010/074171 A1 | 7/2010 |
| WO | WO 2013/125469 A1 | 8/2013 |
| WO | WO 2014/178310 A1 | 11/2014 |
| WO | WO 2015/166795 A1 | 11/2015 |

OTHER PUBLICATIONS

Oikawa et al., Microstructure and Magnetic Properties of CoPtCr—SiO$_2$ Perpendicular Recording Media, IEE Transactions on Magnetics, vol. 38, No. 5, Sep. 2002, pp. 1976-1978.

Piramanayagam, Perpendicular recording media for hard disk drives, Applied Physics Review—Focused Review, Journal of Applied Physics 102, 011301 (2007), pp. 1-22.

Ishikawa et al., Analyses of Stacking Fault Density in Co-Alloy Thin Films by High-Resolution Transmission Electron Microscopy, IEE Transactions on Magnetics, vol. 32, No. 5, Sep. 1996, pp. 3605-3607.

Saito et al., Evaluation of Atomic Layer Stacking Structure and Curie Temperature of Magnetic Films for Thermally Assisted Recording Media (Invited), IEE Transactions on Magnetics, vol. 50, No. 3, Mar. 2014, pp. 3201205.

Ariake, et al., Co—Pt—TiO$_2$ Composite Film for Perpendicular Magnetic Recording Medium, IEE Transactions on Magnetics, vol. 41, No. 10, Oct. 2005, pp. 3142-3144.

Sokalski, et al., Characterization of Oxide Materials for Exchange Decoupling in Perpendicular Thin Film Media, IEE Transactions on Magnetics, vol. 46, No. 6, Jun. 2010, pp. 2260-2263.

PCT, English translation of International Preliminary Report on Patentability for PCT/JP2016/083777, dated May 31, 2018.

* cited by examiner

SPUTTERING TARGET

TECHNICAL FIELD

The present invention relates to sputtering targets, and in particular, to a sputtering target that contains metallic Co, metallic Pt, and an oxide, and with which a magnetic thin film having a high coercive force can be fabricated.

In the present description, the sputtering target that contains metallic Co, metallic Pt, and an oxide may be described as a CoPt-oxide based target. Further, a magnetic thin film that contains metallic Co, metallic Pt, and an oxide may be described as a CoPt alloy-oxide based magnetic thin film.

BACKGROUND ART

A magnetic disk for a hard disk drive utilizes a magnetic thin film having a granular structure of a CoPt-based alloy-oxide as one example of magnetic recording films that serve to record information signals (see, for example, Non-Patent Literature 1). The granular structure is composed of columnar CoPt-based alloy crystal grains and crystal grain boundaries formed from an oxide that surrounds the columnar CoPt-based alloy crystal grains. In order to further improve the recording density of the magnetic thin film having the granular structure of the CoPt-based alloy-oxide, there is a need to micronize the CoPt-based alloy crystal grains contained in the magnetic recording layer (magnetic thin film).

However, the progress of micronization of the CoPt-based alloy crystal grains has resulted in occurrence of the so-called thermal fluctuation phenomenon, in which the superparamagnetic phenomenon impairs the thermal stability of recorded signals and leads to loss of the recorded signals. This thermal fluctuation phenomenon has contributed a major obstacle to increasing the recording density of magnetic disks.

In order to surmount this obstacle, the magnetic energy of respective CoPt-based alloy crystal grains needs to be increased such that the magnetic energy exceeds the thermal energy. The magnetic energy of respective CoPt-based alloy crystal grains is obtained by $v \times K_u$, which is a product of the volume v of the CoPt-based alloy crystal grains and the magnetocrystalline anisotropy constant $K_u$. Therefore, the magnetocrystalline anisotropy constant $K_u$ of the CoPt-based alloy crystal grains needs to be increased in order to increase the magnetic energy (see, for example, Non-Patent Literature 2).

Examples of the measures for increasing $K_u$ of the CoPt-based alloy crystal grains may include one in which stacking faults in respective CoPt-based alloy crystal grains are decreased, and one in which the periodicity of the stacking structure of Co atoms and Pt atoms is improved (see, for example, Non-Patent Literatures 3 and 4).

On the other hand, in order to grow the CoPt-based alloy crystal grains having large $K_u$ in a columnar shape, phase separation between the CoPt-based alloy crystal grains and grain boundary material must be achieved. If the phase separation between the CoPt-based alloy crystal grains and the grain boundary material is insufficient to increase the grain interaction between the CoPt-based alloy crystal grains, the magnetic thin film having the granular structure of the CoPt-based alloy-oxide has had reduced coercive force Hc. As a result, the thermal stability is impaired, and the thermal fluctuation phenomenon may occur with ease. Thus, it is important to reduce the grain interaction between the CoPt-based alloy crystal grains.

In order to satisfy the foregoing requirements, various oxides have been investigated for use as grain boundary materials for the CoPt-based alloy crystal grains (see, for example, Non-Patent Literatures 5 and 6). However, there is no clear guideline for selecting materials, and even today, the investigation for searching oxides used as grain boundary materials for the CoPt-based alloy crystal grains is being continued.

CITATION LIST

Non-Patent Literature

Non-Patent Literature 1: T. Oikawa et al., IEEE TRANSACTIONS ON MAGNETICS, September 2002, VOL.38, NO.5, p.1976-1978

Non-Patent Literature 2: S. N. Piramanayagam, JOURNAL OF APPLIED PHYSICS, 2007, 102, 011301

Non-Patent Literature 3: A. Ishikawa and R. Sinclair, IEEE TRANSACTIONS ON MAGNETICS, September 1996, VOL.32, NO.5, p.3605-3607

Non-Patent Literature 4: S. Saito, S. Hinata, and M. Takahashi, IEEE TRANSACTIONS ON MAGNETICS, March 2014, VOL.50, NO.3, 3201205

Non-Patent Literature 5: J. Ariake, T. Chiba, and N. Honda, IEEE TRANSACTIONS ON MAGNETICS, October 2005, VOL.41, NO.10, p.3142-3144

Non-Patent Literature 6: V. Sokalski, J. Zhu, and D. E. Laughlin, IEEE TRANSACTIONS ON MAGNETICS, June 2010, VOL.46, NO.6, p.2260-2263

SUMMARY OF INVENTION

Technical Problem

In light of such circumstances, an object of the present invention is to provide a sputtering target with which it is possible to form a magnetic thin film having a high coercive force Hc.

Solution to Problem

The inventors of the present invention have diligently carried out studies to solve the above-mentioned problems. As a result, the inventors have found that the oxide suitable for increasing the coercive force Hc of the magnetic thin film is an oxide having a melting point of 600° C. or lower and a standard Gibbs free energy of formation $\Delta Gf$ with respect to 1 mol $O_2$ being $-1,000$ kJ/mol $O_2$ or more and $-500$ kJ/mol $O_2$ or less.

The present invention has been made on the basis of this new findings.

Namely, an aspect of a sputtering target according to the present invention is a sputtering target comprising metallic Co, metallic Pt, and an oxide, wherein the sputtering target contains no metallic Cr except inevitable impurities, and the oxide has a melting point of 600° C. or lower and a standard Gibbs free energy of formation $\Delta Gf$ of the oxide with respect to 1 mol $O_2$ being $-1,000$ kJ/mol $O_2$ or more and $-500$ kJ/mol $O_2$ or less.

It is preferable that the oxide has $B_2O_3$.

It is preferable that the oxide is $B_2O_3$.

It is preferable that the sputtering target comprises 10 to 50 vol % of the oxide, it is more preferable that the sputtering target comprises 20 to 40 vol % of the oxide, and it is still more preferable that the sputtering target comprises 25 to 35 vol % of the oxide.

The sputtering target can be preferably used for forming a magnetic thin film.

Advantageous Effects of Invention

The present invention can provide a sputtering target with which it is possible to form a magnetic thin film having a high coercive force Hc.

DESCRIPTION OF EMBODIMENTS

A sputtering target according to an embodiment of the present invention contains metallic Co, metallic Pt, and an oxide, and is characterized in containing no metallic Cr except inevitable impurities, and in that the oxide contains $B_2O_3$. In the present description, the metallic Co may be simply described as Co and the metallic Pt may be simply described as Pt.

1. Components of Target

The sputtering target according to this embodiment contains Co and Pt as metallic components and may further contain other metals (for example, Au, Ag, Ru, Rh, Pd, Ir, W, Ta, Cu, B, Mo, etc.) unless these metals interfere with formation of the magnetic thin film. As demonstrated in the earlier application of the inventors of the present invention (Japanese Patent Application No. 2014-95566 and PCT/JP2015/061409), the sputtering target cannot contain metallic Cr except inevitable impurities because the presence of metallic Cr has an adverse effect on the magnetocrystalline anisotropy constant $K_u$ of the resulting magnetic thin film.

Metallic Co and metallic Pt are components of magnetic crystal grains (fine magnet) in the granular structure of the magnetic thin film formed by sputtering.

Co is a ferromagnetic metal element and plays a central role in the formation of the magnetic crystal grains (fine magnet) in the granular structure of the magnetic thin film. In order to increase the magnetocrystalline anisotropy constant $K_u$ of the CoPt alloy particles (magnetic crystal grains) in the magnetic thin film obtained by sputtering and to maintain the magnetism of the CoPt alloy particles in the obtained magnetic thin film, the content percentage of Co in the sputtering target according to this embodiment is preferably 20 to 90 at % and more preferably 25 to 85 at % relative to the total metallic components (the total of Co and Pt).

Platinum, when alloying with Co in a predetermined composition range, has the function of reducing the magnetic moment of the alloy and thus has a role of adjusting the magnetic strength of the magnetic crystal grains. In order to increase the magnetocrystalline anisotropy constant $K_u$ of the CoPt alloy particles (magnetic crystal grains) in the magnetic thin film obtained by sputtering and to adjust the magnetism of the CoPt alloy particles (magnetic crystal grains) in the obtained magnetic thin film, the content percentage of Pt in the sputtering target according to this embodiment is preferably 10 to 80 at % and more preferably 15 to 75 at % relative to the total metallic components.

The sputtering target according to this embodiment contains $B_2O_3$ as an oxide component. The oxide component serves as a non-magnetic matrix that separates the magnetic crystal grains (fine magnet) from each other in the granular structure of the magnetic thin film.

The sputtering target according to this embodiment contains $B_2O_3$ as an oxide and may further contain other oxides (for example, $SiO_2$, $TiO_2$, $Ti_2O_3$, $Ta_2O_5$, $Cr_2O_3$, $CoO$, $Co_3O_4$, $MnO$, $Mn_3O_4$, $Fe_2O_3$, $CuO$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, $NiO_2$, etc.) unless these oxides interfere with formation of the magnetic thin film. As demonstrated in Examples described below, using only $B_2O_3$ as an oxide is preferred because using only $B_2O_3$ as an oxide can significantly increase the coercive force Hc of the magnetic thin film deposited at room temperature.

The content percentage of metallic components and the content percentage of oxide components in the entire sputtering target depend on the composition of a desired magnetic thin film. Although not limited, the content percentage of metallic components in the entire sputtering target may be, for example, 88 to 94 mol %, and the content percentage of oxide components in the entire sputtering target may be, for example, 6 to 12 mol %.

As described above, the oxide component serves as a non-magnetic matrix that separates the magnetic crystal grains (fine magnet) from each other in the granular structure of the magnetic thin film. Thus, a large oxide content in the magnetic thin film is preferred because it is easy to assuredly separate the magnetic crystal grains from each other and to make the magnetic crystal grains independent from each other. The oxide content in the sputtering target according to this embodiment is preferably 10 vol % or larger, and more preferably 20 vol % or larger, and still more preferably 25 vol % or larger.

However, an excessively large oxide content in the magnetic thin film has an adverse effect on the crystallinity of the CoPt alloy particles (magnetic crystal grains) because the CoPt alloy particles (magnetic crystal grains) are contaminated with the oxide, which may increase the proportion of structures other than the hcp structure in the CoPt alloy particles (magnetic crystal grains). In addition, an excessively large oxide content in the magnetic thin film reduces the number of the magnetic crystal grains per unit area of the magnetic thin film and thus makes it difficult to increase the recording density. In light of such views, the oxide content in the sputtering target according to this embodiment is preferably 50 vol % or less, more preferably 40 vol % or less, and still more preferably 35 vol % or less.

Therefore, the oxide content in the sputtering target according to this embodiment relative to the entire sputtering target is preferably 10 to 50 vol %, more preferably 20 to 40 vol %, and still more preferably 25 to 35 vol %.

2. Microstructure of Sputtering Target

The microstructure of the sputtering target according to this embodiment is not particularly limited, but is preferably a microstructure in which a metal phase and an oxide phase are finely dispersed in each other. Such a microstructure makes it difficult to generate defects such as nodules and particles during sputtering.

3. Process for Production of Spattering Target

The sputtering target according to this embodiment can be produced, for example, in the following manner.

(1) Preparation of CoPt Alloy-Atomized Powder

Co and Pt are weighed so as to obtain a prescribed composition (the atomic ratio of metallic Co to the total of the metallic Co and metallic Pt is 20 to 90 at %), and a molten CoPt alloy is produced. Subsequently, the molten CoPt alloy is gas-atomized to prepare a CoPt alloy-atomized powder having a prescribed composition (the atomic ratio of metallic Co to the total of the metallic Co and metallic Pt is preferably 20 to 90 at %). The produced CoPt alloy-atomized powder is classified so that the particle size becomes not larger than a predetermined particle size (for example, 106 μm or smaller).

In order to increase the magnetism of the CoPt alloy-atomized powder, the atomic ratio of metallic Co to the total of the metallic Co and metallic Pt contained in the power is preferably 25 at % or larger and more preferably 30 at % or larger.

(2) Preparation of Powder Mixture for Pressure Sintering $AB_2O_3$ powder is added to the CoPt alloy-atomized powder prepared in (1). The mixture is dispersedly mixed with a ball mill to prepare a powder mixture for pressure sintering. By dispersedly mixing the CoPt alloy-atomized powder and the $B_2O_3$ powder with the ball mill, a powder mixture for pressure sintering in which the CoPt alloy-atomized powder and the $B_2O_3$ powder are finely dispersed in each other can be prepared.

In the magnetic thin film formed by using the obtained sputtering target, the volume fraction of the $B_2O_3$ powder in the entire powder mixture for pressure sintering is preferably 10 to 50 vol %, more preferably 20 to 40 vol %, and still more preferably 25 to 35 vol % in order to easily make the magnetic crystal grains independent from each other by assuredly separating the magnetic crystal grains from each other by $B_2O_3$, to makes it easy for the CoPt alloy particles (magnetic crystal grains) to have the hcp structure, and to increase the recording density.

(3) Molding

The powder mixture for pressure sintering prepared in (2) is pressure-sintered and molded using, for example, a vacuum hot pressing method to produce a spattering target. Since the powder mixture for pressure sintering prepared in (2) has been dispersedly mixed with a ball mill and the CoPt alloy-atomized powder and the $B_2O_3$ powder are finely dispersed in each other, defects such as generation of nodules and particles are unlikely to occur during sputtering using the spattering target obtained by this production process.

The method for pressure-sintering the powder mixture for pressure sintering is not limited. The method may be a method other than a vacuum hot pressing method and may be, for example, a HIP method.

(4) Modification

The example production process described in (1) to (3) involves preparing the CoPt alloy-atomized powder by an atomizing method, adding the $B_2O_3$ powder to the prepared CoPt alloy-atomized powder, and dispersedly mixing the mixture with the ball mill to prepare the powder mixture for pressure sintering. A Co single powder and a Pt single powder may be used instead of using the CoPt alloy-atomized powder. In such a case, three types of powder, which are a Co single powder, a Pt single powder, and a $B_2O_3$ powder, are dispersedly mixed with a ball mill to prepare a powder mixture for pressure sintering.

EXAMPLES

As demonstrated in the earlier application of the inventors of the present invention (Japanese Patent Application No. 2014-95566 and PCT/JP2015/061409), since the presence of metallic Cr has an adverse effect on the magnetocrystalline anisotropy constant $K_u$ of the resulting magnetic thin film, sputtering targets for use in formation of magnetic thin films are free of metallic Cr except inevitable impurities in the present invention.

In Examples and Comparative Examples descried below, studies were carried out using 13 types of oxides in total, provided that the sputtering targets for use in formation of the magnetic thin films were free of metallic Cr except inevitable impurities (the magnetic crystal grains in the magnetic thin film were formed from a CoPt alloy that did not contain metallic Cr except inevitable impurities).

Example 1

A magnetic recording film was formed by sputtering with a DC sputtering apparatus. The magnetic recording film was formed on a glass substrate. The stacked structure of the formed magnetic recording film includes, in order of increasing distance from the glass substrate, Ta (5 nm, 0.6 Pa)/Pt (6 nm, 0.6 Pa)/Ru (10 nm, 0.6 Pa)/Ru (10 nm, 8 Pa)/$Co_{60}Cr_{40}$-26 vol % $SiO_2$ (2 nm, 4 Pa)/CoPt alloy-$B_2O_3$ (16 nm, 8 Pa)/C (7 nm, 0.6 Pa). The number on the left side in parenthesis indicates the film thickness, and the number on the right side indicates the pressure of an Ar atmosphere during sputtering. CoPt alloy-$B_2O_3$ is a magnetic thin film that serves as the recording layer of a perpendicular magnetic recording medium.

The composition of the entire target prepared as Example 1 is 91.4 (80Co-20Pt) −7.5$B_2O_3$ in terms of molar ratio. The target was prepared and evaluated in the following manner. The composition of the entire target prepared in Example 1, when the content percentage of the oxide ($B_2O_3$) is expressed as the volume fraction in the entire target, is (80Co-20Pt)-30 vol % $B_2O_3$.

To prepare the target according to Example 1, an 80Co-20Pt alloy-atomized powder was prepared first. Specifically, metals were weighed so as to obtain an alloy composition of Co: 80 at % and Pt: 20 at % and heated to 1500° C. or higher to prepare a molten alloy. The molten alloy was gas-atomized to prepare an 80Co-20Pt alloy-atomized powder.

The prepared 80Co-20Pt alloy-atomized powder was separately classified through 150 mesh sieves to obtain 80Co-20Pt alloy-atomized powder having a particle diameter of 106 μm or smaller.

To 1150 g of the classified 80Co-20Pt alloy-atomized powder, 74.78 g of a $B_2O_3$ powder was added. Then, the mixture was mixed and dispersed by a ball mill to obtain a powder mixture for pressure sintering. The cumulative rotation number of a ball mill was 2,805,840.

The obtained powder mixture (30 g) for pressure sintering was subjected to hot pressing under the conditions of sintering temperature: 720° C., pressure: 24.5 MPa, time: 30 min, and atmosphere: $5 \times 10^{-2}$ Pa or lower to prepare a sintered test piece (φ30 mm). The relative density of the prepared sintered test piece was 99.009%. The calculated density is 9.04 g/cm³.

Figure 4:
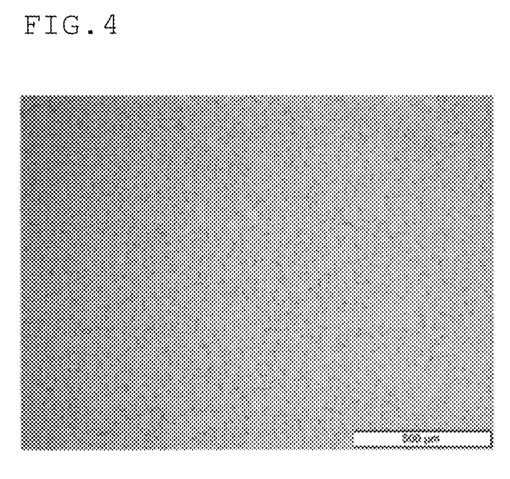
FIG. 4 is a metallurgical microscope photograph of the cross section in the thickness direction of a sintered test piece according to Example 1.
Figure 5:
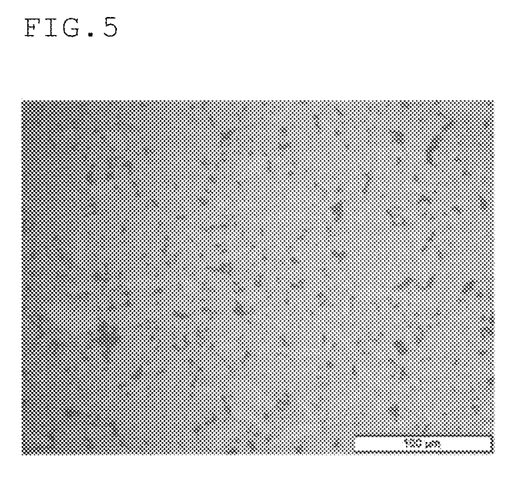
FIG. 5 is a metallurgical microscope photograph of the cross section in the thickness direction of a sintered test piece according to Example 1.

FIG. 4 and FIG. 5 are metallurgical microscope photograph of the cross section in the thickness direction of the obtained sintered test piece. FIG. 4 is a photograph at a photographing magnification of 100 times (a bar scale in the photograph represents 500 μm), and FIG. 5 is a photograph at a photographing magnification of 500 times (a bar scale in the photograph represents 100 μm).

As can be seen from FIG. 4 and FIG. 5, the 80Co-20Pt-alloy phase and the $B_2O_3$ phase were finely dispersed in and mixed with each other.

Next, the prepared powder mixture for pressure sintering was subjected to hot pressing under the conditions of sintering temperature: 720° C., pressure: 24.5 MPa, time: 60 min, and atmosphere: $5 \times 10^{-2}$ Pa or lower to prepare a target with (φ153.0×1.0 mm+φ161.0×4.0 mm. The relative density of the prepared target was 101.0%.

The prepared target was evaluated for leakage flux on the basis of ASTM F2086-01. As a result, the average magnetic leakage flux rate was 30.9%. This average magnetic leakage flux rate is sufficient for favorable magnetron sputtering.

Next, a magnetic thin film made of (80Co-20Pt) –30 vol % $B_2O_3$ was deposited on a substrate by magnetron sputtering using the prepared target to produce a sample for determining magnetic properties. The stacked structure of this sample for determining magnetic properties includes, as was described earlier, in order of increasing distance from the glass substrate, glass/Ta (5 nm, 0.6 Pa)/Pt (6 nm, 0.6 Pa)/Ru(10 nm, 0.6 Pa)/Ru(10 nm, 8 Pa)/$Co_{60}Cr_{40}$-26 vol % $SiO_2$ (2 nm, 4 Pa)/CoPt alloy-$B_2O_3$ (16 nm, 8 Pa)/C (7 nm, 0.6 Pa). The number on the left side in parenthesis indicates the film thickness, and the number on the right side indicates the pressure of an Ar atmosphere during sputtering.

CoPt alloy-$B_2O_3$ is a magnetic thin film deposited by using the target prepared in present Example. This magnetic thin film was deposited at room temperature without heating the substrate during film deposition.

The hysteresis loop was measured using a magneto-optical Kerr effect apparatus for the resulting sample for determining magnetic properties thereof. The coercive force Hc was read from the hysteresis loop. As a result, the read value of the coercive force Hc was 8.8 kOe. It should be noted that the coercive forces Hc of magnetic thin films available on the basis of the current technology are about 6 to 7 kOe.

Figure 1:
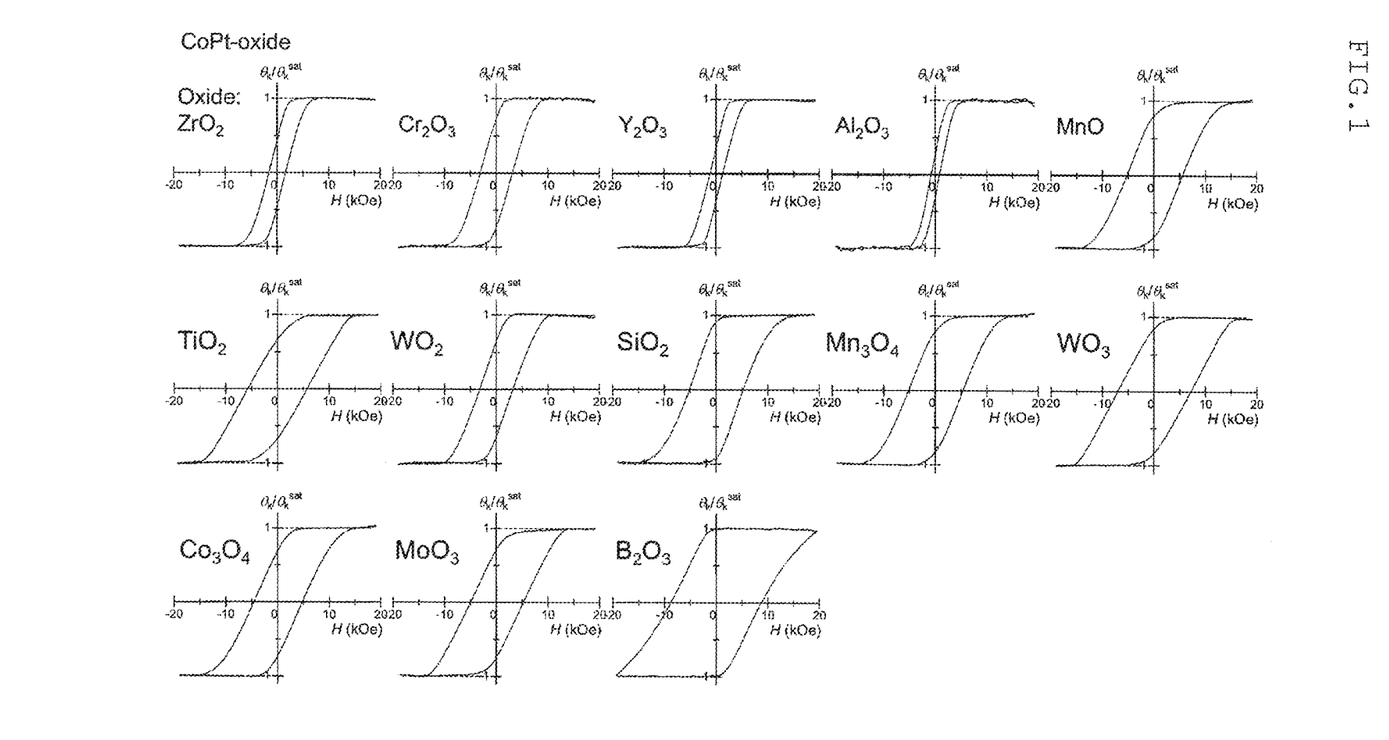
FIG. 1 is a set of graphs showing hysteresis loops of magnetic thin films (CoPt alloy-oxide based magnetic thin films).

The hysteresis loop of Example 1 is shown in FIG. 1 together with the results of other Comparative Examples. The horizontal axis of FIG. 1 represents the strength of the magnetic field applied. The vertical axis of FIG. 1 represents the value normalized by dividing the rotation angle (Kerr rotation angle) of the polarization axis of incident light by the saturation Kerr rotation angle.

Figure 2:
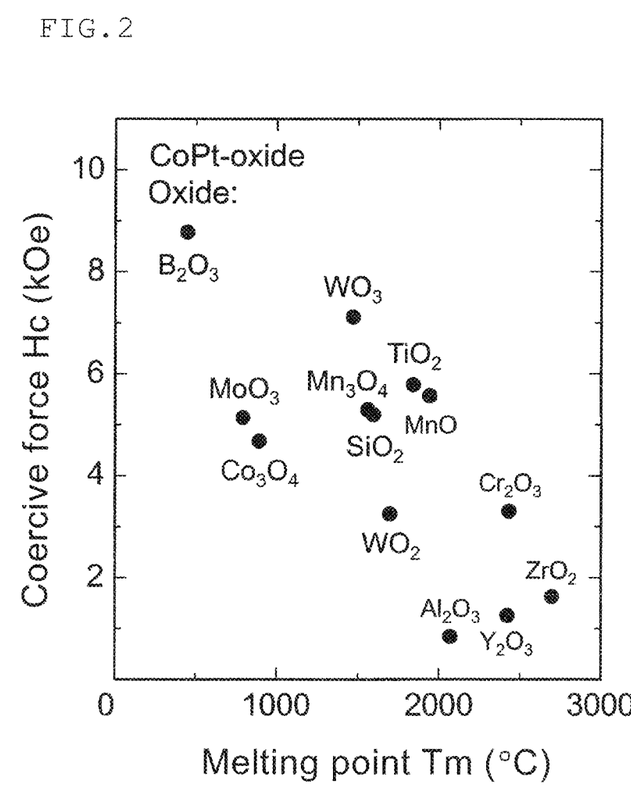
FIG. 2 is a graph showing a relationship between a melting point Tm of oxide and a coercive force Hc of magnetic thin film (CoPt alloy-oxide based magnetic thin films).
Figure 3:
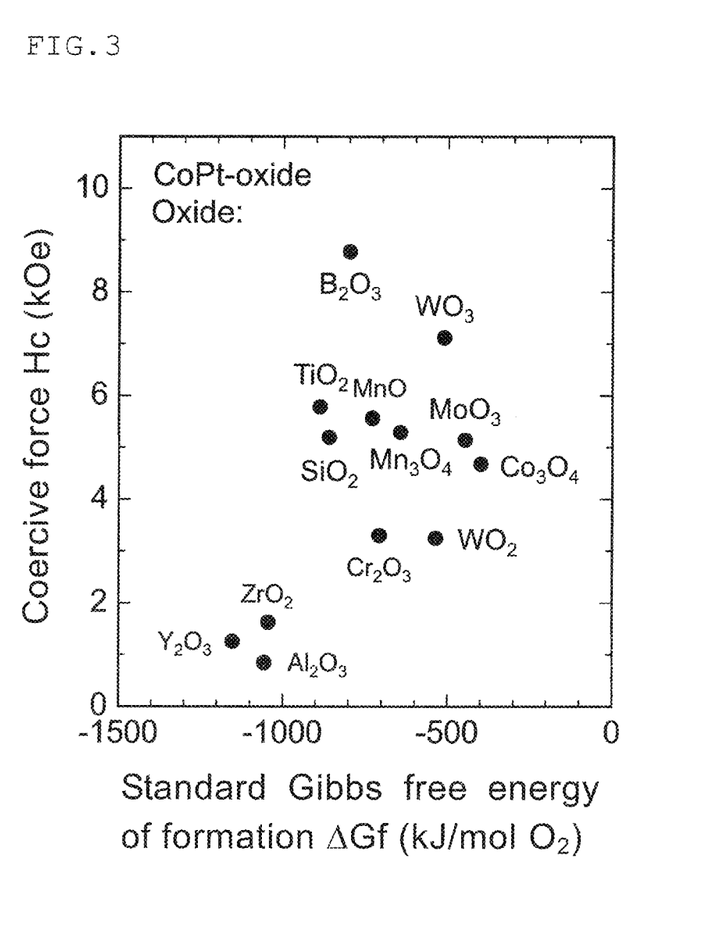
FIG. 3 is a graph showing a relationship between a standard Gibbs free energy of formation ΔGf of oxide with respect to 1 mol $O_2$ and a coercive force Hc of magnetic thin film (CoPt alloy-oxide).

FIGS. 2 and 3 show the measured result of the coercive force Hc together with the results of Comparative Examples. The vertical axis of FIGS. 2 and 3 represents the coercive force Hc while the horizontal axis of FIG. 2 represents a melting point Tm (° C.) of oxide and the horizontal axis of FIG. 3 represents a standard Gibbs free energy of formation ΔGf (kJ/mol $O_2$) with respect to 1 mol $O_2$ when oxide is formed.

Comparative Example 1

The composition of the entire target prepared as Comparative Example 1 is (80Co-20Pt)-30 vol % $WO_3$. A target was prepared in the same manner as in Example 1 except that $WO_3$ was used as an oxide. Samples for determining magnetic properties were also prepared in the same manner as in Example 1 by using the prepared target.

The hysteresis loop was measured, using a magneto-optical Kerr effect apparatus, for the sample for determining magnetic properties in the same manner as in Example 1. Then, the coercive force Hc was read from the hysteresis loop. As a result, the read value of the coercive force Hc was 7.1 kOe. The hysteresis loop of Comparative Example 1 is shown in FIG. 1 together with the results of other Examples and Comparative Examples. FIGS. 2 and 3 also show the measured result of the coercive force Hc together with the results of other Examples and Comparative Examples.

Comparative Example 2

The composition of the entire target prepared as Comparative Example 2 is (80Co-20Pt)–30 vol % $TiO_2$. A target was prepared in the same manner as in Example 1 except that $TiO_2$ was used as an oxide. Samples for determining magnetic properties were also prepared in the same manner as in Example 1 by using the prepared target.

The hysteresis loop was measured, using a magneto-optical Kerr effect apparatus, for the sample for determining magnetic properties in the same manner as in Example 1. Then, the coercive force Hc was read from the hysteresis loop. As a result, the read value of the coercive force Hc was 5.8 kOe. The hysteresis loop of Comparative Example 2 is shown in FIG. 1 together with the results of other Examples and Comparative Examples. FIGS. 2 and 3 also show the measured result of the coercive force Hc together with the results of other Examples and Comparative Examples.

Comparative Example 3

The composition of the entire target prepared as Comparative Example 3 is (80Co-20Pt)–30 vol % $SiO_2$. A target was prepared in the same manner as in Example 1 except that $SiO_2$ was used as an oxide. Samples for determining magnetic properties were also prepared in the same manner as in Example 1 by using the prepared target.

The hysteresis loop was measured, using a magneto-optical Kerr effect apparatus, for the sample for determining magnetic properties in the same manner as in Example 1. Then, the coercive force Hc was read from the hysteresis loop. As a result, the read value of the coercive force Hc was 5.2 kOe. The hysteresis loop of Comparative Example 3 is shown in FIG. 1 together with the results of other Examples and Comparative Examples. FIGS. 2 and 3 also show the measured result of the coercive force Hc together with the results of other Examples and Comparative Examples.

Comparative Example 4

The composition of the entire target prepared as Comparative Example 4 is (8020 Pt)–30 vol % $Al_2O_3$. A target was prepared in the same manner as in Example 1 except that $Al_2O_3$ was used as an oxide. Samples for determining magnetic properties were also prepared in the same manner as in Example 1 by using the prepared target.

The hysteresis loop was measured, using a magneto-optical Kerr effect apparatus, for the sample for determining magnetic properties in the same manner as in Example 1. Then, the coercive force Hc was read from the hysteresis loop. As a result, the read value of the coercive force Hc was 0.8 kOe. The hysteresis loop of Comparative Example 4 is shown in FIG. 1 together with the results of other Examples and Comparative Examples. FIGS. 2 and 3 also show the measured result of the coercive force Hc together with the results of other Examples and Comparative Examples.

Comparative Example 5

The composition of the entire target prepared as Comparative Example 5 is (80Co-20Pt)–30 vol % $MoO_3$. A target was prepared in the same manner as in Example 1 except that $MoO_3$ was used as an oxide. Samples for determining magnetic properties were also prepared in the same manner as in Example 1 by using the prepared target.

The hysteresis loop was measured, using a magneto-optical Kerr effect apparatus, for the sample for determining magnetic properties in the same manner as in Example 1. Then, the coercive force Hc was read from the hysteresis loop. As a result, the read value of the coercive force Hc was 5.1 kOe. The hysteresis loop of Comparative Example 5 is shown in FIG. 1 together with the results of other Examples and Comparative Examples. FIGS. 2 and 3 also show the measured result of the coercive force Hc together with the results of other Examples and Comparative Examples.

Comparative Example 6

The composition of the entire target prepared as Comparative Example 6 is (80Co-20Pt)–30 vol % $ZrO_2$. A target was prepared in the same manner as in Example 1 except that $ZrO_2$ was used as an oxide. Samples for determining magnetic properties were also prepared in the same manner as in Example 1 by using the prepared target.

The hysteresis loop was measured, using a magneto-optical Kerr effect apparatus, for the sample for determining magnetic properties in the same manner as in Example 1. Then, the coercive force Hc was read from the hysteresis loop. As a result, the read value of the coercive force Hc was 1.6 kOe. The hysteresis loop of Comparative Example 6 is shown in FIG. 1 together with the results of other Examples and Comparative Examples. FIGS. 2 and 3 also show the measured result of the coercive force Hc together with the results of other Examples and Comparative Examples.

Comparative Example 7

The composition of the entire target prepared as Comparative Example 7 is (80Co-20Pt)–30 vol % $Co_3O_4$. A target was prepared in the same manner as in Example 1 except that $Co_3O_4$ was used as an oxide. Samples for determining magnetic properties were also prepared in the same manner as in Example 1 by using the prepared target.

The hysteresis loop was measured, using a magneto-optical Kerr effect apparatus, for the sample for determining magnetic properties in the same manner as in Example 1. Then, the coercive force Hc was read from the hysteresis loop. As a result, the read value of the coercive force Hc was 4.7 kOe. The hysteresis loop of Comparative Example 7 is shown in FIG. 1 together with the results of other Examples and Comparative Examples. FIGS. 2 and 3 also show the measured result of the coercive force Hc together with the results of other Examples and Comparative Examples.

Comparative Example 8

The composition of the entire target prepared as Comparative Example 8 is (80Co-20Pt)–30 vol % MnO. A target was prepared in the same manner as in Example 1 except that MnO was used as an oxide. Samples for determining magnetic properties were also prepared in the same manner as in Example 1 by using the prepared target.

The hysteresis loop was measured, using a magneto-optical Kerr effect apparatus, for the sample for determining magnetic properties in the same manner as in Example 1. Then, the coercive force Hc was read from the hysteresis loop. As a result, the read value of the coercive force Hc was 5.6 kOe. The hysteresis loop of Comparative Example 8 is shown in FIG. 1 together with the results of other Examples and Comparative Examples. FIGS. 2 and 3 also show the measured result of the coercive force Hc together with the results of other Examples and Comparative Examples.

Comparative Example 9

The composition of the entire target prepared as Comparative Example 9 is (80Co-20Pt)–30 vol % $Cr_2O_3$. A target was prepared in the same manner as in Example 1 except that $Cr_2O_3$ was used as an oxide. Samples for determining magnetic properties were also prepared in the same manner as in Example 1 by using the prepared target.

The hysteresis loop was measured, using a magneto-optical Kerr effect apparatus, for the sample for determining magnetic properties in the same manner as in Example 1. Then, the coercive force Hc was read from the hysteresis loop. As a result, the read value of the coercive force Hc was 3.3 kOe. The hysteresis loop of Comparative Example 9 is shown in FIG. 1 together with the results of other Examples and Comparative Examples. FIGS. 2 and 3 also show the measured result of the coercive force Hc together with the results of other Examples and Comparative Examples.

Comparative Example 10

The composition of the entire target prepared as Comparative Example 10 is (80Co-20Pt)–30 vol % $Y_2O_3$. A target was prepared in the same manner as in Example 1 except that $Y_2O_3$ was used as an oxide. Samples for determining magnetic properties were also prepared in the same manner as in Example 1 by using the prepared target.

The hysteresis loop was measured, using a magneto-optical Kerr effect apparatus, for the sample for determining magnetic properties in the same manner as in Example 1. Then, the coercive force Hc was read from the hysteresis loop. As a result, the read value of the coercive force Hc was 1.2 kOe. The hysteresis loop of Comparative Example 10 is shown in FIG. 1 together with the results of other Examples and Comparative Examples. FIGS. 2 and 3 also show the measured result of the coercive force Hc together with the results of other Examples and Comparative Examples.

Comparative Example 11

The composition of the entire target prepared as Comparative Example 11 is (80Co-20Pt)–30 vol % $WO_2$. A target was prepared in the same manner as in Example 1 except that $WO_2$ was used as an oxide. Samples for determining magnetic properties were also prepared in the same manner as in Example 1 by using the prepared target.

The hysteresis loop was measured, using a magneto-optical Kerr effect apparatus, for the sample for determining magnetic properties in the same manner as in Example 1. Then, the coercive force Hc was read from the hysteresis loop. As a result, the read value of the coercive force Hc was 3.3 kOe. The hysteresis loop of Comparative Example 11 is shown in FIG. 1 together with the results of other Examples and Comparative Examples. FIGS. 2 and 3 also show the measured result of the coercive force Hc together with the results of other Examples and Comparative Examples.

Comparative Example 12

The composition of the entire target prepared as Comparative Example 12 is (80Co-20Pt)-30 vol % $Mn_3O_4$. A target was prepared in the same manner as in Example 1 except that $Mn_3O_4$ was used as an oxide. Samples for determining magnetic properties were also prepared in the same manner as in Example 1 by using the prepared target.

The hysteresis loop was measured, using a magneto-optical Kerr effect apparatus, for the sample for determining magnetic properties in the same manner as in Example 1. Then, the coercive force Hc was read from the hysteresis loop. As a result, the read value of the coercive force Hc was 5.3 kOe. The hysteresis loop of Comparative Example 12 is shown in FIG. 1 together with the results of other Examples and Comparative Examples. FIGS. 2 and 3 also show the measured result of the coercive force Hc together with the results of other Examples and Comparative Examples.

Discussion About Types of Oxides (Example 1 and Comparative Examples 1 to 12)

The following table 1 lists the melting points and the standard Gibbs free energies ΔGf of formation with respect to 1 mol $O_2$ of the oxides used in Example 1 and Comparative Examples 1 to 12, and the values of the coercive forces Hc of the magnetic thin films obtained as the samples for determining magnetic properties of Example 1 and Comparative Examples 1 to 12. Note that the content of each of the oxides used in Example 1 and Comparative Examples 1 to 12 is 30 vol % relative to the entire target.

TABLE 1

| oxide | oxide content (vol %) | melting point Tm (° C.) | ΔGf (kJ/mol $O_2$) | Coercive force Hc (kOe) |
|---|---|---|---|---|
| $B_2O_3$ (Example 1) | 30 | 450 | −795.8 | 8.8 |
| $WO_3$ (Comparative Example 1) | 30 | 2473 | −509.4 | 7.1 |
| $TiO_2$ (Comparative Example 2) | 30 | 1843 | −885.0 | 5.8 |
| $SiO_2$ (Comparative Example 3) | 30 | 1600 | −856.7 | 5.2 |
| $Al_2O_3$ (Comparative Example 4) | 30 | 2072 | −1054.6 | 0.8 |
| $MoO_3$ (Comparative Example 5) | 30 | 795 | −445.3 | 5.1 |
| $ZrO_2$ (Comparative Example 6) | 30 | 2700 | −1042.8 | 1.6 |
| $Co_3O_4$ (Comparative Example 7) | 30 | 895 | −397.1 | 4.7 |
| MnO (Comparative Example 8) | 30 | 1945 | −725.8 | 5.6 |
| $Cr_2O_3$ (Comparative Example 9) | 30 | 2435 | −705.3 | 3.3 |
| $Y_2O_3$ (Comparative Example 10) | 30 | 2425 | −1151.3 | 1.2 |
| $WO_2$ (Comparative Example 11) | 30 | 1700 | −533.9 | 3.3 |
| $Mn_3O_4$ (Comparative Example 12) | 30 | 1564 | −641.5 | 5.3 |

As can be seen from Table 1 and FIGS. 2 and 3, the value of the coercive force Hc of the magnetic thin film tends to increase as the melting point Tm of the used oxide becomes lower, and the value is remarkably large when the melting point is 600° C. or lower. On the other hand, when the standard Gibbs free energy of formation ΔGf of the oxide with respect to 1 mol $O_2$ is considered, the value of the coercive force Hc of the magnetic thin film tends to increase if the standard Gibbs free energy of formation ΔGf of the oxide falls within the range of −1,000 kJ/mol $O_2$ or more and −500 kJ/mol $O_2$ or less.

Thus, the oxide suitable for increasing the coercive force Hc of the magnetic thin film is considered to have a melting point of 600° C. or lower and a standard Gibbs free energy of formation ΔGf with respect to 1 mol $O_2$ being −1,000 kJ/mol $O_2$ or more and −500 kJ/mol $O_2$ or less.

At present it is uncertain why the oxide suitable for increasing the coercive force Hc of the magnetic thin film has a melting point of 600° C. or lower and a standard Gibbs free energy of formation ΔGf with respect to 1 mol $O_2$ being −1,000 kJ/mol $O_2$ or more and −500 kJ/mol $O_2$ or less. However, why the value of the coercive force Hc of the magnetic thin film tends to increase as the melting point Tm of the used oxide becomes lower can be explained as follows. Specifically, the Ru layer located at the lower layer than the magnetic thin film (closer to the substrate) has a surface with irregularities. During the cooling process after sputtering, the CoPt alloy, which has a relatively high melting point of 1460° C., is first selectively deposited on the projected portions of the Ru layer ($Co_{60}Cr_{40}$-26 vol % $SiO_2$ layer on the surface of the projected portion of the Ru layer) to grow in a columnar shape while the oxide having the low melting point is still in a liquid state. Thus, it is assumed that the oxide in the liquid state is present between the CoPt alloy particles growing in a columnar shape. As the cooling progresses further, the liquid oxide present between the CoPt alloy particles is solidified, and the oxide becomes wall body to separate between the CoPt alloy particles having grown in a columnar shape and form a granular structure.

Thus, the use of an oxide having a low melting point assuredly separates the CoPt alloy particles by the wall body of the oxide. As the result, the interaction between the CoPt alloy particles becomes small. Thus, it is assumed that the magnetic thin film using the oxide having a low melting point has a larger coercive force Hc.

Note that the smaller the standard Gibbs free energy of formation ΔGf of an oxide with respect to 1 mol $O_2$ is (larger minus value), the more stable the oxide is as an oxide. From the viewpoint of this, it is assumed that the smaller standard Gibbs free energy of formation ΔGf of an oxide (ΔGf of larger minus value) with respect to 1 mol $O_2$ is preferred.

Further, as can be seen from Table 1, the oxide $B_2O_3$ used for the sputtering target of Example 1 has a melting point Tm of 450° C., which is equal to or lower than 600° C., and the standard Gibbs free energy of formation ΔGf with respect to 1 mol $O_2$ of −795.8 kJ/mol $O_2$, which is −1,000 kJ/mol $O_2$ or more and −500 kJ/mol $O_2$ or less. Thus, the sputtering target of Example 1 is encompassed by the present invention. The coercive force Hc of the sample for determining magnetic properties produced in Example 1 is 8.8 kOe, which is remarkably larger than those of Comparative Examples 1 to 12 using other oxides, and the sample produced in Example 1 is the only sample that has the coercive force Hc exceeding 8 kOe.

Therefore, it is assumed that the most appropriate means to increase the coercive force Hc of the CoPt alloy-oxide based magnetic thin film is to use the CoPt alloy-oxide based target using $B_2O_3$ as in Example 1.

Additional Studies About Content of Oxide
(Examples 2 to 8)

As discussed above, the previous studies suggest that the most appropriate means to increase the coercive force Hc of the CoPt alloy-oxide based magnetic thin film is to use the CoPt alloy-oxide based target using $B_2O_3$ as in Example 1.

However, the $B_2O_3$ content in the sputtering targets used in Example 1 was 30 vol %, only one type of content.

Therefore, additional studies were carried out by producing a plurality of targets (the composition of Co and Pt was 80Co-20Pt) in the same manner as in Example 1 except that the content of $B_2O_3$ was changed. The $B_2O_3$ contents in the sputtering targets in additional studies (Examples 2 to 8) were 10 vol % in Example 2, 15 vol % in Example 3, 20 vol % in Example 4, 25 vol % in Example 5, 35 vol % in Example 6, 40 vol % in Example 7, and 50 vol % in Example 8. Samples for determining magnetic properties were prepared in the same manner as in Example 1 by using the prepared target.

The hysteresis loop was measured, using a magneto-optical Kerr effect apparatus, for the sample for determining magnetic properties in the same manner as in Example 1. Then, the coercive force Hc was read from the hysteresis loop.

The following table 2 lists these measurement results together with the measurement results of Example 1.

TABLE 2

| oxide | oxide content (vol %) | Coercive force Hc (kOe) |
|---|---|---|
| $B_2O_3$ (Example 2) | 10 | 5.5 |
| $B_2O_3$ (Example 3) | 15 | 7.1 |
| $B_2O_3$ (Example 4) | 20 | 7.6 |
| $B_2O_3$ (Example 5) | 25 | 8.2 |
| $B_2O_3$ (Example 1) | 30 | 8.8 |
| $B_2O_3$ (Example 6) | 35 | 8.5 |
| $B_2O_3$ (Example 7) | 40 | 8.1 |
| $B_2O_3$ (Example 8) | 50 | 6.2 |

As can be seen from Table 2, all the coercive forces Hc in Examples 1 to 8 exceed 5 kOe, showing favorable results. Thus, when the CoPt-oxide target using $B_2O_3$ as the oxide is used and the content of $B_2O_3$ relative to the entire target is 10 vol % or more and 50 vol % or less, it is assumed that the favorable magnetic thin film having a coercive force Hc exceeding 5 kOe can be obtained.

Furthermore, as can be seen from Table 2, when the content of $B_2O_3$ relative to the entire target is 20 vol % or more and 40 vol % or less, the favorable magnetic thin films having a coercive force Hc of 7.6 kOe or larger are obtained. Thus, it is assumed that the content of $B_2O_3$ relative to the entire target should more preferably be 20 vol % or more and 40 vol % or less.

Furthermore, as can be seen from Table 2, when the content of $B_2O_3$ relative to the entire target is 25 vol % or more and 35 vol % or less, the favorable magnetic thin films having a coercive force Hc of 8.2 kOe or larger are obtained. Thus, it is assumed that the content of $B_2O_3$ relative to the entire target should particularly preferably be 25 vol % or more and 35 vol % or less.

INDUSTRIAL APPLICABILITY

The sputtering target according to the present invention is a sputtering target with which a magnetic thin film having a high coercive force can be fabricated, and thus has industrial applicability.

The invention claimed is:

1. A sputtering target consisting of metallic Co, metallic Pt, and an oxide, wherein
   the sputtering target contains no metallic Cr except inevitable impurities,
   the oxide is $B_2O_3$, and
   the sputtering target comprises 10 to 50 vol % of $B_2O_3$.

2. The sputtering target according to claim 1, wherein the sputtering target comprises 20 to 40 vol % of $B_2O_3$.

3. The sputtering target according to claim 1, wherein the sputtering target comprises 25 to 35 vol % of $B_2O_3$.

* * * * *